United States Patent [19]

Kawanabe

[11] Patent Number: 5,458,158

[45] Date of Patent: Oct. 17, 1995

[54] LEAD CUTTING APPARATUS AND AN ANTICORROSIVE COAT STRUCTURE OF LEAD

[75] Inventor: Masatoshi Kawanabe, Kanagawa, Japan

[73] Assignee: Toyo Communication Equipment Co., Ltd., Kanagawa, Japan

[21] Appl. No.: 305,854

[22] Filed: Sep. 14, 1994

Related U.S. Application Data

[63] Continuation of Ser. No. 39,650, Mar. 30, 1993, abandoned.

[51] Int. Cl.⁶ .................................................. B21F 45/00
[52] U.S. Cl. ........................ 140/105; 29/566.3; 72/331
[58] Field of Search .......................... 29/566.3; 72/325, 72/326, 331, 332, 334, 338, 700; 140/105

[56] References Cited

U.S. PATENT DOCUMENTS

| | | | |
|---|---|---|---|
| 3,348,405 | 10/1967 | Johnson | 72/325 |
| 3,650,026 | 3/1972 | Freeman | 29/160.6 |
| 3,903,934 | 9/1975 | Vizy | 140/105 |
| 3,993,108 | 11/1976 | Kirschenman et al. | 140/105 |
| 4,945,953 | 8/1990 | Kronberg | 140/105 |

FOREIGN PATENT DOCUMENTS

| | | | |
|---|---|---|---|
| 3446153 | 6/1986 | Germany | 140/105 |
| 241208 | 12/1986 | Germany | 72/334 |
| 6408024 | 1/1965 | Netherlands | 72/326 |

Primary Examiner—Lowell A. Larson
Attorney, Agent, or Firm—Koda and Androlia

[57] ABSTRACT

A lead cutting apparatus for cutting the leads or pins of electric and electronic devices into a predetermined length in the manufacturing process including inclined pressing surface(s) and cutting edge(s) for cutting the leads, which are covered with an anticorrosive coat, at a cutting position. The inclined pressing surface(s) is at an appropriate angle relative to the length of the leads and presses, between the pressing surface and an opposite inclined or non-inclined pressing surface, the leads near the cutting positions, thus cutting the leads into a shape that becomes gradually thinner to a very small thickness. The cut ends of the leads are covered with the anticorrosive coat and thus prevented from rusting without requiring any anticorrosive treatment. Accordingly, the manufacturing cost of the electric and electrical devices can be reduced greatly.

2 Claims, 6 Drawing Sheets

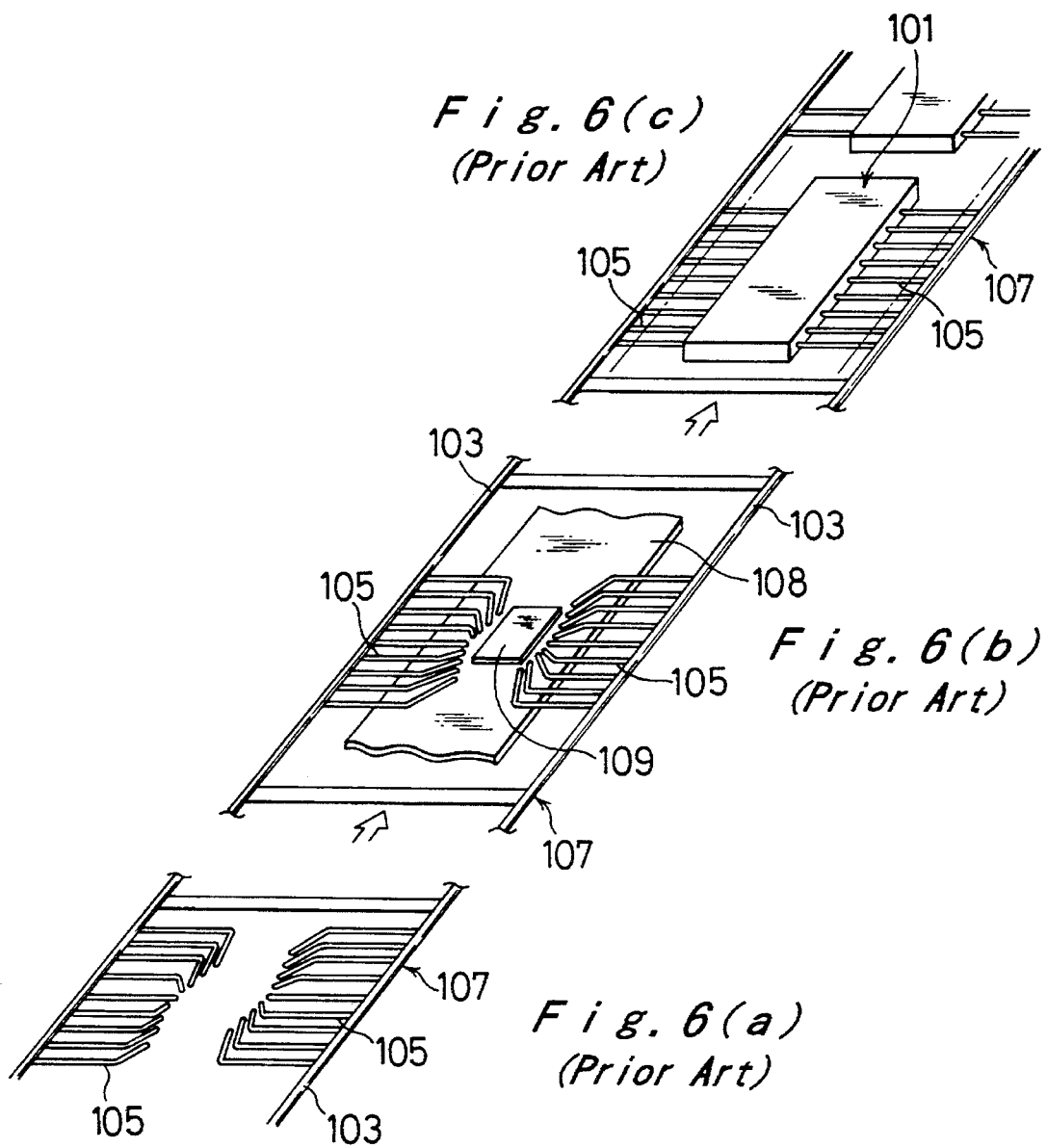

LEAD CUTTING APPARATUS AND AN ANTICORROSIVE COAT STRUCTURE OF LEAD

This is a continuation of application Ser. No. 08/039,650, filed Mar. 30, 1993, now abandoned.

BACKGROUND OF THE INVENTION

1. Field of the Invention

The present invention relates to a lead cutting apparatus for cutting leads of electric and electronic devices and more specifically to a lead cutter which cuts leads or pins of electric and electronic devices and forms an anticorrosive coat at the cut ends and also to an anticorrosive coat structure of leads.

2. Prior Art

Conventional electric and electronic devices used for, for example, communication equipment are manufactured by the process described below.

FIGS. 6(a) through 6(c) are schematic diagrams which illustrate a manufacturing process of a dual in-line module.

As shown in these Figure, a lead frame 107 is comprised of a pair of connecting strips 103 and sets of pectinated leads 105 projected from the connecting strips 103 at appropriate intervals. An IC device 109 is conveyed by a belt 108 and is placed between a set of leads 105, and internal circuits (not shown) of the IC device 109 are electrically connected to the 105 by wire bonding. The IC device 109 is then embedded together with the leads 105 in a synthetic resin such as an epoxy by molding. The leads 105 are made of an alloy, and the surface of the leads is plated with, for example, tin in order to prevent rusting.

A molded IC device 101 is mounted on a lead cutter (not shown), and the leads 105 are cut at a predetermined portion, for example, as shown by the dotted lines in FIG. 6(c), so that each lead has an appropriate length.

FIGS. 7(a) and 7(b) show a conventional lead cutter 201 used for cutting and shaping the leads 105 of a molded IC device 101.

The lead cutter 201 is comprised of an upper die 203, a lower die 205, and a cutting blade 207. The upper die 203 is moved up and down in a vertical line, and the cutting blade 207 is also moved vertically along the side surface of the upper die 203. The cutting blade 207 has a flat-front end 207a at right angles relative to the longitudinal direction of the cutting blade 207 and has a cutting edge formed at the inside edge of the front end 207a.

In this conventional lead cutter, after the molded IC device 101 is mounted on the lead cutter 201, the upper die 203 is moved downward so that the under surface of the upper die 203 comes into contact with the upper surface of the lead 105 as shown in FIG. 7(b). A gap between the upper and lower dies 203 and 205 is predetermined so as to be almost the same as the thickness of the lead 105. As a result, the leads 105 are pressed and folded into a shape of a crank. Then, the cutting blade 207 is moved in the direction indicated by an arrow A to shear the leads 105.

After the leads 105 are cut, the cutting blade 207 and the upper die 203 are moved back to their initial positions, respectively, and the IC module 101 with the leads crank-shaped is dismounted from the cutter 201.

The lead cutter 209 shown in FIG. 8 has the same construction as the cutter 201 illustrated in FIGS. 7(a) and 7(b) except that the cutting blade 211 is moved upward in contact with the lower die 205 when the leads 105 are cut.

The IC modules 101 manufactured as described above is mounted on a printed circuit board (not shown), then the leads 105 are soldered to conductors on the printed circuit board.

However, according to the conventional lead cutters, the metallic material inside each lead 15 is exposed, as shown in FIGS. 9 and 10, at the cut ends 113 without the anticorrosive coat 111. Thus, the exposed metallic material may be rusted by the time the IC module 101 is mounted on a printed circuit board, and the rust formed on the cut ends causes the solderability of the lead to deteriorate and the reliability of soldering to decrease.

If the conventional lead cutter shown in FIG. 8 is used for cutting the leads of the molded IC chip 101, a little anticorrosive coat 111a may remain at the lower portion of the cut end 113 as shown in FIG. 10. The anticorrosive coat 111a, which contacts the conductor on the printed circuit board when the IC module is mounted on the printed circuit board, promotes a solderability of the leads 105. On the other hand, if the lead is cut by the conventional lead cutter shown in FIG. 7, a little anticorrosive coat 111a remains at the upper portion of the cut end 113 as shown in FIG. 9, and the anticorrosive coat 111a that exists at the upper portion of the lead does not contribute to soldering.

In view of the above, an anticorrosive treatment at the cut ends is required after the shaping and cutting of the leads are finished in order to prevent the cut ends of the leads from rusting. However, this anticorrosive treatment increases the number of the steps of the manufacturing process and causes the manufacturing cost to be higher.

SUMMARY OF THE INVENTION

Accordingly, the first object of the present invention is to provide a cutting apparatus which can cut and shape the leads of electric and electronic devices and makes it possible to form an anticorrosive coat on the cut ends of the leads.

The second object of the present invention is to provide a structure of the lead using the apparatus, thus increasing the yield of the soldering process.

In order to achieve the objects described above, the lead cutting apparatus of the present invention includes (a) a pair of dies which holds leads of electric and electronic devices in between, one of the dies having a projected portion to dig into the leads, and (b) a cutting blade movably provided along the dies to cut the leads. The projected portion of the die has an inclined pressing surface which is inclined by appropriate degrees relative to the longitudinal direction of the leads and is used for forming the cut ends of the leads that are covered with an anticorrosive coat. The cut ends of the leads cut by the lead cutting apparatus of the present invention have an anticorrosive coat structure in which the cut ends of the leads become gradually thinner to a very small thickness with the anticorrosive coat on the surface so that the metallic material core of the leads is practically not exposed at the cut ends.

Therefore, the cut ends of the leads can be prevented from rusting without performing an anticorrosive treatment thereon. Thus, the manufacturing cost can be reduced.

BRIEF DESCRIPTION OF THE DRAWINGS

FIGS. 6(a), 6(b) and 6(c) show a schematic diagram which illustrates a manufacturing process or IC modules;

DETAILED DESCRIPTION OF THE INVENTION

Hereinafter, preferred embodiments of the present invention will be described with reference to the accompanying drawings.

Figure 1:
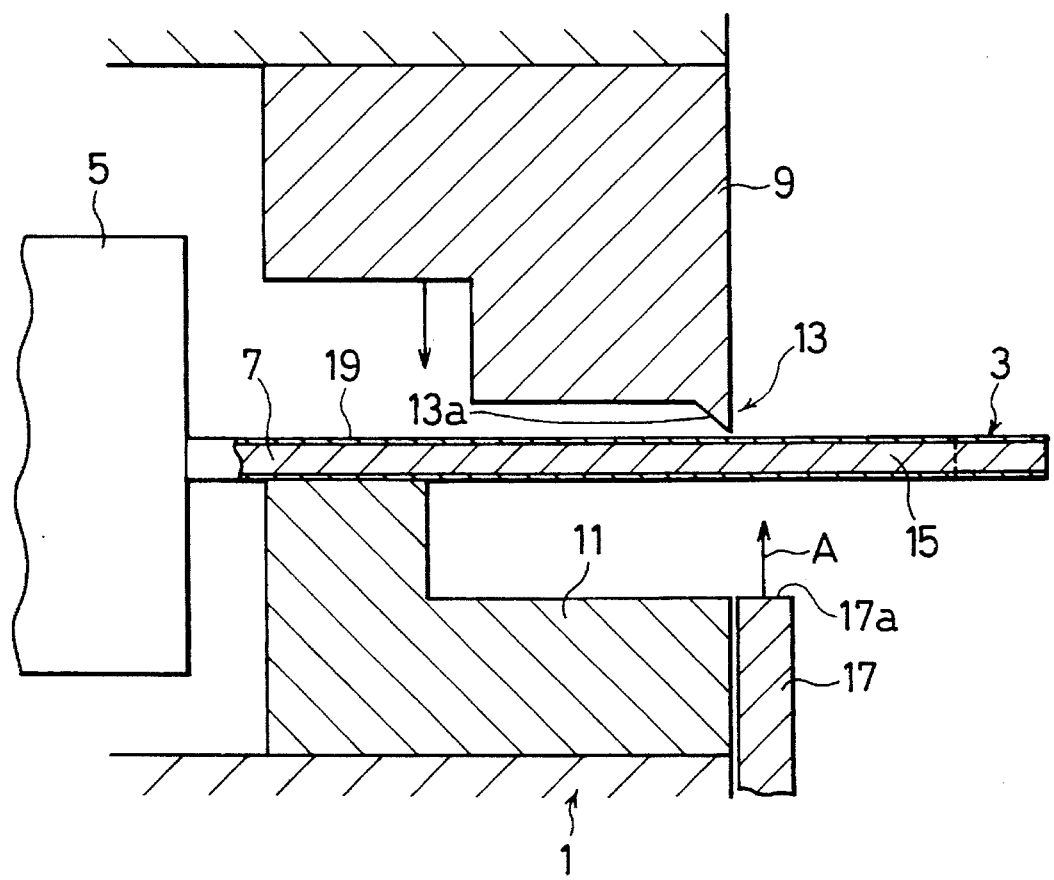
FIG. 1 shows a cross-sectional view of one side of an embodiment of the lead cutter or lead cutting apparatus according to the present invention.

FIG. 1 is a cross-sectional view of the lead cutting apparatus according to the present invention.

In this embodiment, the lead cutting apparatus has functions for cutting and shaping the leads 15 that project from a lead frame 3 and connected to IC devices 5. Each one of the leads 15 has a core 7 covered with anticorrosive coat 19.

The cutting apparatus 1 is comprised of an upper die 9, a lower die 11, and a cutting blade 17. The lower die 11 of the cutting apparatus 1 has an L-shaped cross section and is installed on the base member of the cutting apparatus. The upper die 9 also has an L-shaped cross section and is provided under a movable member of the cutting apparatus.

A projected portion 13 is formed at the side portion of the bottom surface of the upper die 9 by being gradually projected downward from the inside flat portions. The length of the projected portion 13 in the vertical direction is designed so as to be practically equal to the thickness of the lead 15, and the projected portion 13 has a pressing surface 13a used for forming cut ends on the leads having an anticorrosive coat. In this embodiment, the pressing surface 13a is inclined by 50 degrees relative to the longitudinal direction of the lead 15.

The cutting blade 17 having a flat front end 17a is provided along the side surface of the lower die 11 and is moved up and down in the direction indicated by arrow A.

After the IC module 5 is mounted on the cutting apparatus 1 as shown in FIG. 1, the upper die 9 is operated downward to press the leads 15 (only one lead is shown in FIG. 1). When the tip of the projected portion 13 comes into contact with the upper surface of the lower die 11, the downward movement of the upper die 9 is stopped.

Therefore, the leads 15 are formed into a shape of a crank, and each one of the cut end portions pressed by the pressing surface 13a becomes thinner toward the tip of the lead.

After the upper die 9 is stopped, the cutting blade 17 is moved in the direction indicated by the arrow A to cut the leads 15 while the leads 15 are held by the upper and lower dies 9 and 11.

Figure 2:
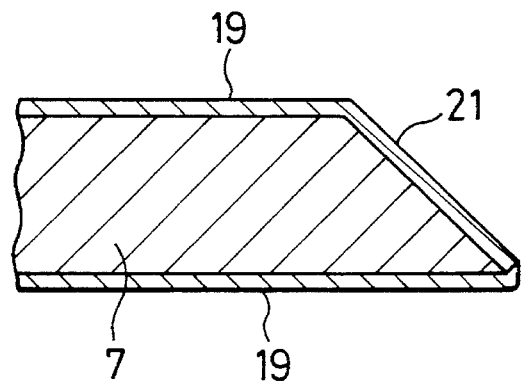
FIG. 2 shows a longitudinal-sectional view of a lead cut by the lead cutter of the present invention.

As a result, each one of the leads that is shaped and cut by the cutting apparatus 1 of the present invention has a tapered end 21 as shown in FIG. 2.

In particular, since the portion of each lead 15 to be cut is pressed to a very small thickness by the projected portion 13 of the upper die 9 with the anticorrosive coat 19, the metallic core 7 of the lead 15 exposed at the cut end is practically reduced to zero.

In this embodiment, the projected portion 13 is provided on the upper die 9; however, the projected portion can be formed on the lower die 11, and the molded IC, in this case, is mounted upside down on the lead cutting apparatus.

Figure 3:
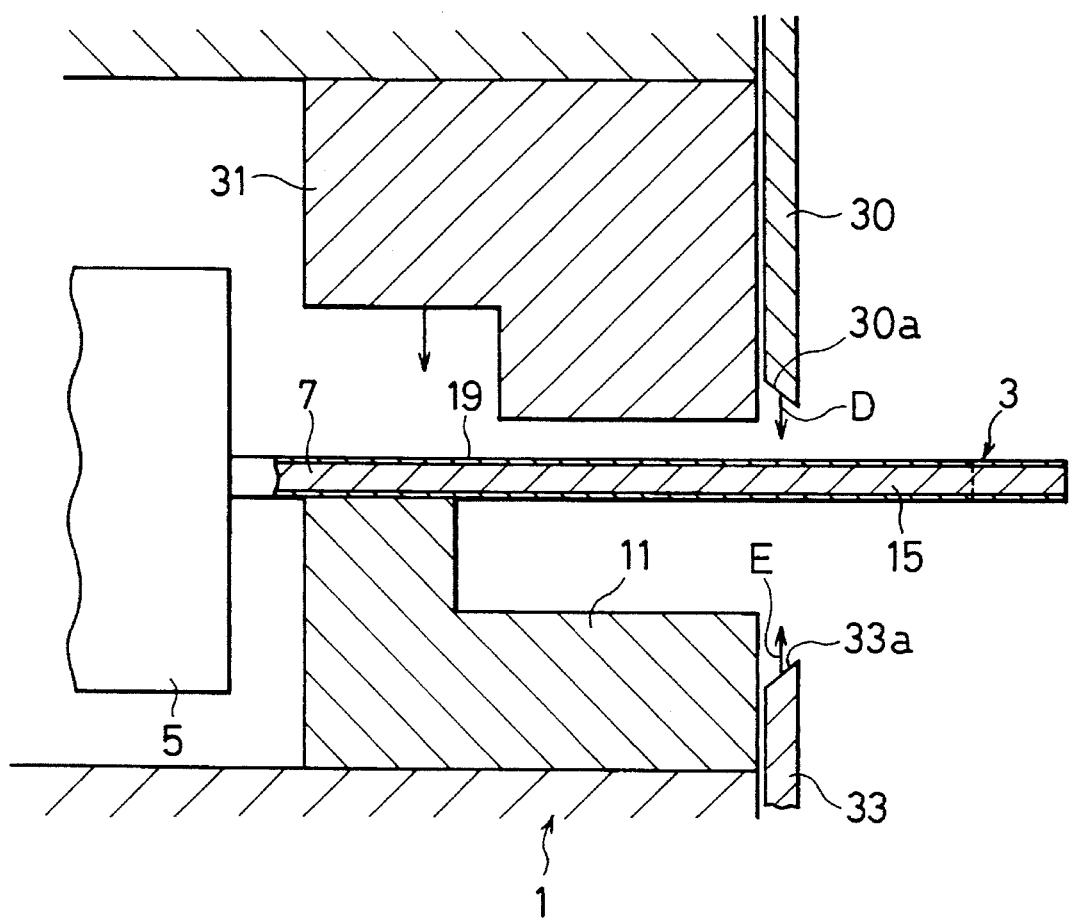
FIG. 3 shows a cross-sectional view of one side of another embodiment of the lead cutter according to the present invention.

FIG. 3 shows another embodiment of the cutting apparatus of the present invention. Elements which are the same as those of FIG. 1 are labeled with the same symbols, and a description of the same elements will be omitted.

In this embodiment, in place of the projected portion 13 on the upper die 9 as shown in FIG. 1, an upper cutting blade 30, which can be moved in the vertical direction, is provided along the side surface of the upper die 31, and the front end of the upper cutting blade 30 has an inclined surface 30a. The length of the inclined surface 30a in the vertical direction is designed so as to be practically equal to half of the thickness of the leads 15.

Furthermore, the front end of a lower cutting blade 33, which is vertically movable along the side surface of the lower die 11, also has an inclined surface 33a, and the length of the inclined surface 33a in the vertical direction is set to be the same as that of the upper cutting blade 30.

When an IC module 5 is mounted on the cutting apparatus 1, the upper die 31 is operated to move down in order to press the leads 15. The leads 15 are thus formed into a shape of a crank.

After the leads 15 are held between the upper and lower dies 31 and 11, the upper and lower cutting blades 30 and 33 are moved to press and cut the leads 15 in the direction indicated by arrows D and E, respectively.

When the tips of the upper and lower cutting blades come into contact with or get closer with each other, the upper and lower cutting blades are stopped, and then the upper and lower cutting blades are moved back to their initial position. The leads 15 are thus cut at a predetermined position.

Figure 4:
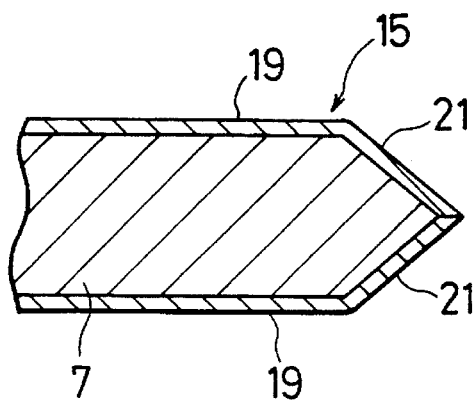
FIG. 4 shows an enlarged longitudinal-sectional view of a lead cut by the lead cutter of the present invention.

FIG. 4 shows a magnified cross sectional view of one of the leads 15 cut by the cutting apparatus shown in FIG. 3.

The lead 15, which has the anticorrosive coat 19, has a tapered cut end 21 since the lead 15 is cut by the upper and lower cutting blades 30 and 33 while the lead 15 is pressed into a very small thickness with inclined surfaces 30a and 33a. Therefore, the metallic core 7 of the lead 15 exposed at the cut end is practically reduced to zero.

In this embodiment, two cutting blades, each having an inclined surface, are provided on the cutting apparatus; however, it is possible to provide an inclined surface on one of the two blades. In this case, the blade with the inclined surface is operated so that the tip end of the inclined surface of the blade comes into contact with or gets closer to the surface of the upper or lower die.

Figure 5:
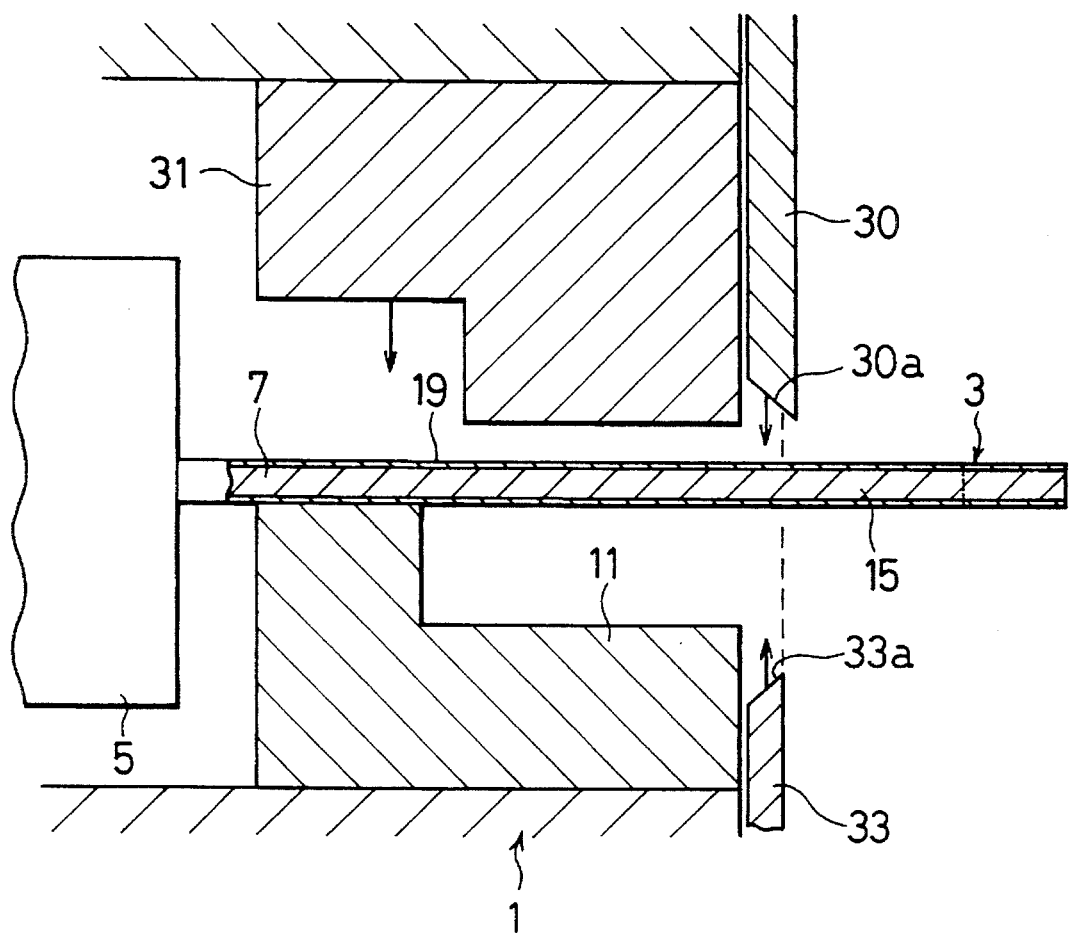
FIG. 5 shows a cross-sectional view of one side of still another embodiment of the lead cutter according to the present invention.
Figure 7A:
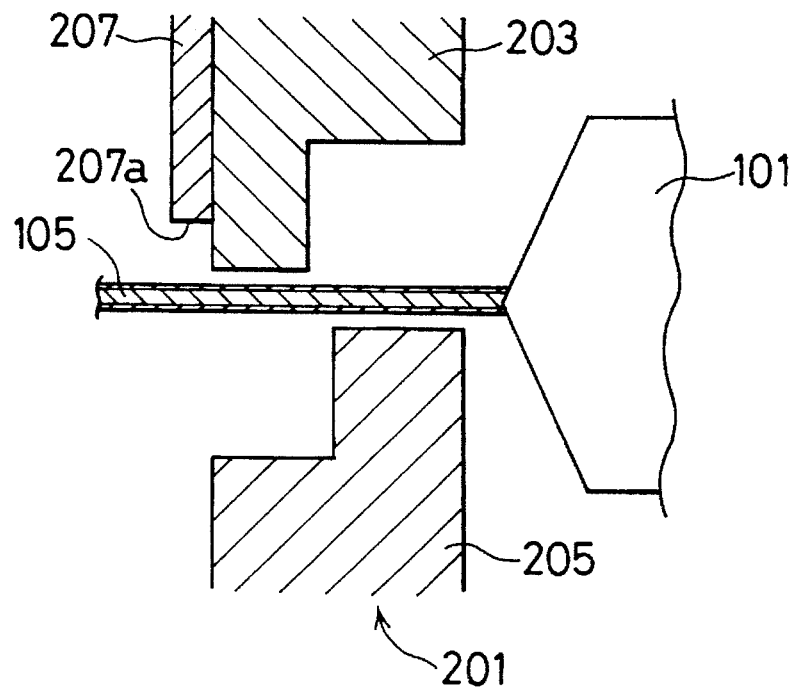
FIGS. 7(a) and 7(b) show a cross-sectional view of one side of another conventional lead cutter.
Figure 7B:
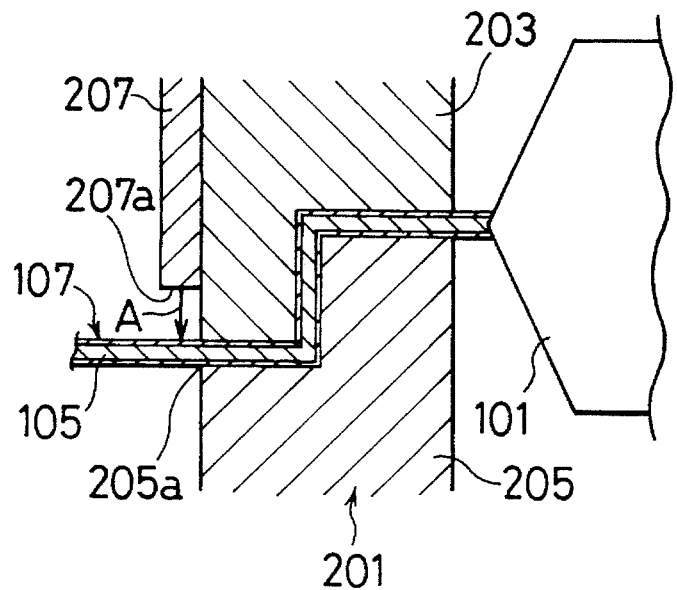
Figure 8:
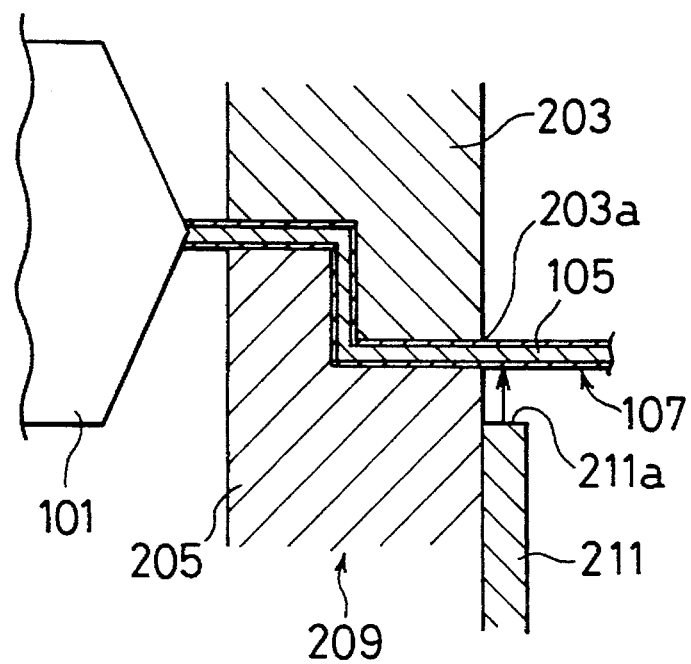
FIG. 8 shows a cross-sectional view of one side of still another conventional lead cutter.
Figure 9:
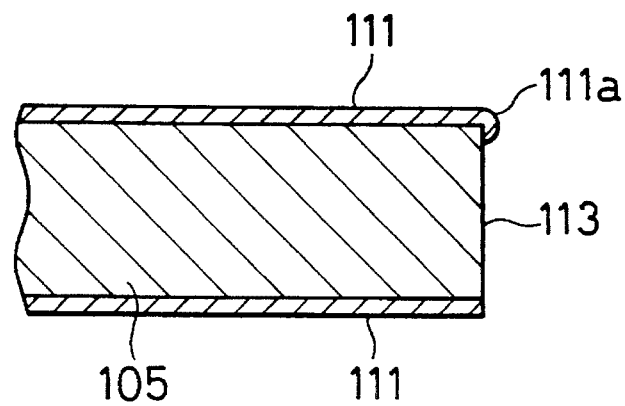
FIG. 9 shows an enlarged longitudinal-sectional view of a lead cut by the conventional lead cutter of FIG. 7.
Figure 10:
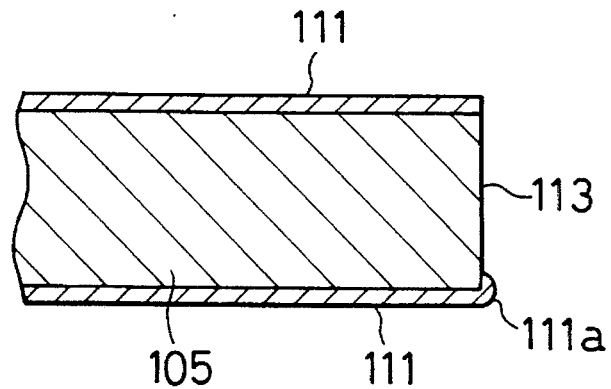
FIG. 10 shows an enlarged longitudinal-sectional view of a lead cut by the conventional lead cutter of FIG. 8.

FIG. 5 shows another embodiment of the present invention. In this embodiment, the cutting edges of the upper and lower cutting blades 30 and 33 are offset with each other so that the leads 15 are cut between a cutting edge of one cutting blade and an inclined surface of the other cutting blade. More specifically, the upper cutting blade 30 is thicker than the lower cutting blade 33 so that the length of the inclined surface 30a of the upper cutting blade 30 is longer than that of the inclined surface 33*a* of the lower cutting blade 33. With this arrangement, the leads 15 are cut between the inclined surface 30*a* of the upper cutting blade 30 and the cutting edge of the inclined surface 33*a* of the lower cutting blade 33.

The lead cutting apparatus of the present invention may be integrated with a lead shaping apparatus as described above or may be a single function apparatus for cutting only.

In addition, the lead cutting apparatus of this invention can be used not only for IC and LSI devices mentioned in the above description but also for other various electric and electronic devices with the lead made of a metal or alloy with an anticorrosive coat thereon and cut to a predetermined length, such as connectors and packaged circuit modules. The arrangement of the leads of the devices may be single in-line, dual in-line, quad flat, and so on.

As described above, the present invention provides a lead cutting apparatus by which an anticorrosive coat can cover the cut ends of the leads since the leads are cut by the cutting blade or blades as the leads are pressed by the inclined portion of the blade or the die.

The invention has been described in detail with particular reference to the preferred embodiments thereof, but it should be understood that variations and modification can be effected within the spirit and the scope of the invention.

I claim:

1. A lead cutting apparatus for cutting leads of electric and electronic devices covered with an anticorrosive coating comprising:

a pair of dies which holds leads of electronic devices in between and forms said leads into crank shape in cross section, one of said dies having a projected portion to dig into and press said leads, and a cutting blade movably provided along said dies to cut said leads, said projected portion of said die having an inclined pressing surface, which is inclined by appropriate degrees relative to a longitudinal direction of said leads, said projected portion digging into and pressing said leads to form cut ends of said leads covered with said anticorrosive coating.

2. A lead cutting apparatus according to claim 1 wherein a length of said projected portion of said die in a vertical direction is practically equal to a thickness of said leads.

\* \* \* \* \*